(12) United States Patent
Burr

(10) Patent No.: US 8,082,762 B2
(45) Date of Patent: Dec. 27, 2011

(54) WEARABLE ARTICLE WITH BAND PORTION ADAPTED TO INCLUDE TEXTILE-BASED ELECTRODES AND METHOD OF MAKING SUCH ARTICLE

(75) Inventor: Stacey B. Burr, West Lafayette, IN (US)

(73) Assignee: Textronics, Inc., Wilmington, DE (US)

( * ) Notice: Subject to any disclaimer, the term of this patent is extended or adjusted under 35 U.S.C. 154(b) by 0 days.

(21) Appl. No.: 12/940,121

(22) Filed: Nov. 5, 2010

(65) Prior Publication Data
US 2011/0067454 A1 Mar. 24, 2011

Related U.S. Application Data

(62) Division of application No. 11/553,680, filed on Oct. 27, 2006, now Pat. No. 7,878,030.

(51) Int. Cl.
*D04B 1/00* (2006.01)
(52) U.S. Cl. .............. 66/175; 66/176; 66/171; 66/202
(58) Field of Classification Search ......... 66/172 E, 66/169 R, 171, 190, 191, 192, 193, 202, 175, 66/176; 600/390, 391, 386
See application file for complete search history.

(56) References Cited

U.S. PATENT DOCUMENTS

| | | | |
|---|---|---|---|
| 1,816,475 A * | 7/1931 | Emery | 66/172 R |
| 3,487,662 A * | 1/1970 | Safrit et al. | 66/173 |
| 3,499,172 A * | 3/1970 | Milner | 2/240 |
| 3,826,246 A | 7/1974 | Raddi et al. | |
| 3,875,768 A * | 4/1975 | Arndt | 66/172 R |
| 3,987,650 A * | 10/1976 | Negri | 66/177 |
| 4,120,294 A | 10/1978 | Wolfe | |
| 4,160,711 A | 7/1979 | Nishizawa et al. | |
| 4,239,046 A | 12/1980 | Ong | |

(Continued)

FOREIGN PATENT DOCUMENTS

CA 2428884 A1 5/2002

(Continued)

OTHER PUBLICATIONS

G. Troster, "The Agenda of Wearable Healthcare," IMIA Yearbook of Medical Informatics 2005: Ubiquitons Health Care Systems, Hauz R., Kulikouskim C., eds. Stuttgart 2004 pp. 125-138.

(Continued)

*Primary Examiner* — Danny Worrell, Jr.
(74) *Attorney, Agent, or Firm* — Connolly Bove Lodge & Hutz LLP

(57) ABSTRACT

A circular knit tubing adapted for making a wearable article has a first knitted single layer tubular portion and a second knitted single layer tubular portion separated by a junction portion. The second tubular portion is folded over the first tubular portion at a fold line in the junction portion. The first and second tubular portions are then joined together, whereby the junction portion forms a band or welt. After the band is formed, the second tubular portion is folded back to cover the band. The wearable article may be a shirt having single layer top and bottom portions with a central double welt portion for physical contact around the wearer's chest or torso. The junction portion forming the band or welt preferably is integrally knitted with the first and second tubular portions. The band or welt defines a central opening to receive an electronic or electrical device or other component.

21 Claims, 4 Drawing Sheets

U.S. PATENT DOCUMENTS

| | | | |
|---|---|---|---|
| 4,554,923 A | 11/1985 | Batters | |
| 4,572,960 A | 2/1986 | Ebneth et al. | |
| 4,583,547 A | 4/1986 | Granek et al. | |
| 4,664,118 A | 5/1987 | Batters | |
| 4,809,700 A | 3/1989 | Castelli et al. | |
| 4,911,169 A | 3/1990 | Ferrari | |
| 5,103,504 A | 4/1992 | Dordevic | |
| 5,275,861 A | 1/1994 | Vaughn | |
| 5,289,824 A | 3/1994 | Mills et al. | |
| 5,317,269 A | 5/1994 | Mills et al. | |
| 5,365,935 A | 11/1994 | Righter et al. | |
| 5,374,283 A | 12/1994 | Flick | |
| 5,467,773 A | 11/1995 | Bergelson et al. | |
| 5,503,887 A | 4/1996 | Diaz et al. | |
| 5,586,556 A | 12/1996 | Spivey et al. | |
| 5,771,027 A | 6/1998 | Marks et al. | |
| 5,906,004 A | 5/1999 | Lebby et al. | |
| 5,968,854 A | 10/1999 | Akopian et al. | |
| 6,047,203 A * | 4/2000 | Sackner et al. | 600/388 |
| 6,066,093 A | 5/2000 | Kelly et al. | |
| 6,145,551 A | 11/2000 | Jayaraman et al. | |
| 6,210,771 B1 | 4/2001 | Post et al. | |
| 6,341,504 B1 * | 1/2002 | Istook | 66/172 E |
| 6,356,238 B1 | 3/2002 | Gainor et al. | |
| 6,377,216 B1 | 4/2002 | Cheadle et al. | |
| 6,381,482 B1 | 4/2002 | Jayaraman et al. | |
| 6,399,879 B1 | 6/2002 | Ueda et al. | |
| 6,496,721 B1 | 12/2002 | Yonce | |
| 6,677,917 B2 | 1/2004 | Van Heerden et al. | |
| 6,680,707 B2 | 1/2004 | Allen et al. | |
| 6,736,759 B1 | 5/2004 | Stubbs et al. | |
| 6,738,265 B1 | 5/2004 | Svarfvar et al. | |
| 6,748,260 B2 | 6/2004 | Au et al. | |
| D492,999 S | 7/2004 | Lax | |
| 6,788,978 B2 | 9/2004 | Vesnaver et al. | |
| 6,854,296 B1 | 2/2005 | Miller, III | |
| 6,941,775 B2 | 9/2005 | Sharma | |
| 6,970,731 B1 | 11/2005 | Jayaraman et al. | |
| 6,993,940 B2 * | 2/2006 | Rabinowicz et al. | 66/176 |
| 7,559,902 B2 | 7/2009 | Ting et al. | |
| 7,878,030 B2 * | 2/2011 | Burr | 66/173 |
| 2003/0224681 A1 | 12/2003 | Koch | |
| 2004/0023576 A1 | 2/2004 | Rock et al. | |
| 2004/0215089 A1 | 10/2004 | Bergelson et al. | |
| 2004/0235381 A1 | 11/2004 | Iwasaki et al. | |
| 2005/0034485 A1 * | 2/2005 | Klefstad-Sillonville et al. | 66/171 |
| 2006/0117805 A1 | 6/2006 | Valentine et al. | |
| 2006/0183990 A1 | 8/2006 | Tolvanen | |
| 2011/0067454 A1 * | 3/2011 | Burr | 66/171 |

FOREIGN PATENT DOCUMENTS

| | | |
|---|---|---|
| EP | 1 319 741 A1 | 6/2003 |
| FR | 2 745 690 A1 | 9/1997 |
| GB | 1467344 | 3/1977 |
| GB | 2 116 725 A | 9/1983 |
| GB | 2342846 | 4/2000 |
| WO | WO-92/13352 A1 | 8/1992 |
| WO | WO-01/02052 A2 | 1/2001 |
| WO | WO-01/37366 A1 | 5/2001 |
| WO | WO-01/39326 A1 | 5/2001 |
| WO | WO-0157298 A1 | 8/2001 |
| WO | WO-02/071935 A1 | 9/2002 |
| WO | WO-03094717 A1 | 11/2003 |
| WO | WO-2004/006700 A1 | 1/2004 |
| WO | WO-2004/058346 A1 | 7/2004 |
| WO | WO-2004/097089 A1 | 11/2004 |
| WO | WO-2004/100784 A2 | 11/2004 |
| WO | WO-2005032366 A1 | 4/2005 |
| WO | WO-2006101748 | 9/2006 |

OTHER PUBLICATIONS

A.M. Albisser, et al., "Atraumatic electrodes for cardiac monitoring," Journal of Association for the Advancement of Medical Instrumentation, vol. 5, No. 2, Apr. 1971.

Carla Hertleer, et al., "Intelligent Textiles for Children in a Hospital Environment," 2nd Autex Conference, Jul. 2002, pp. 44-48.

Scilingo E.P., et al., "Performance Evaluation of Sensing Fabrics for Monitoring Physiological and Biomechanical Variables," IEEE Transcations on Information Technology in Biomedicine, vol. 9, No. 3, Sep. 2005, pp. 345-352.

Krzysztof Gniotek, et al., "The Basic Problems of Textronics," Fibres & Textiles, Jan./Mar. 2004, vol. 12, No. 1 (45), pp. 13-16.

Wijesiriwardana et al., "Fiber-Meshed Trasducers Based Real Time Wearable Physiological Information Monitoring System" Processing of the Eighth International Symposium on Werable Computers (ISWC 2004).

* cited by examiner

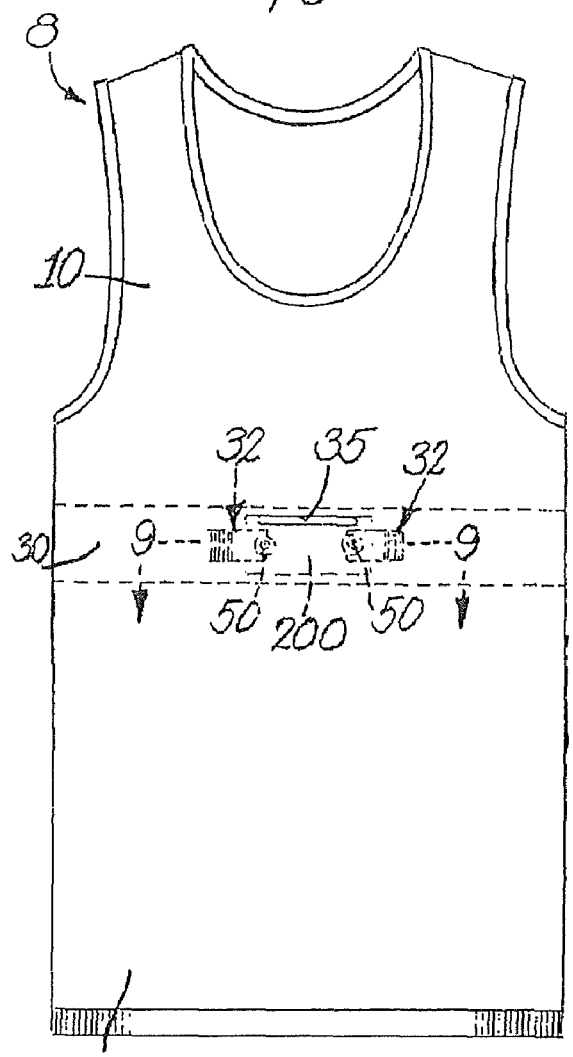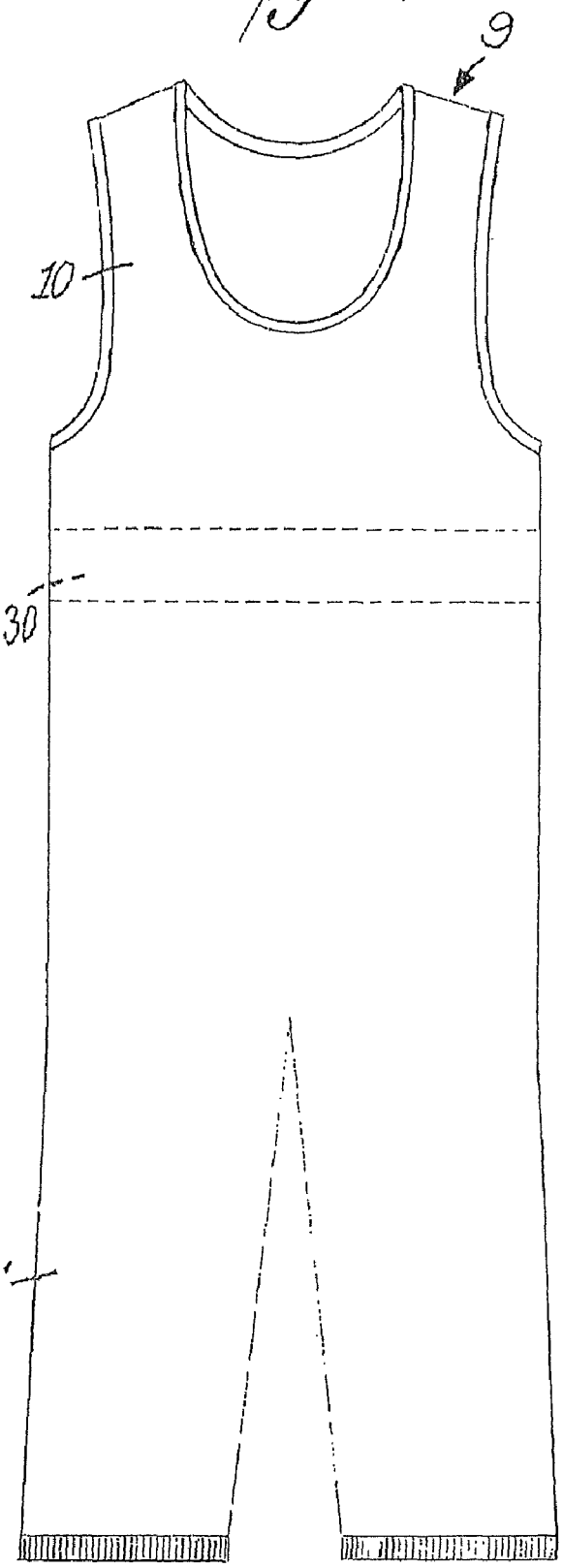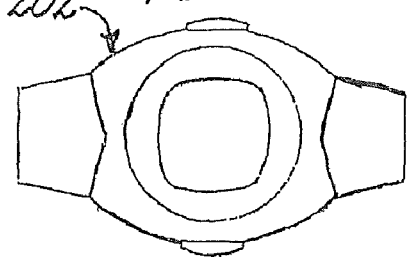

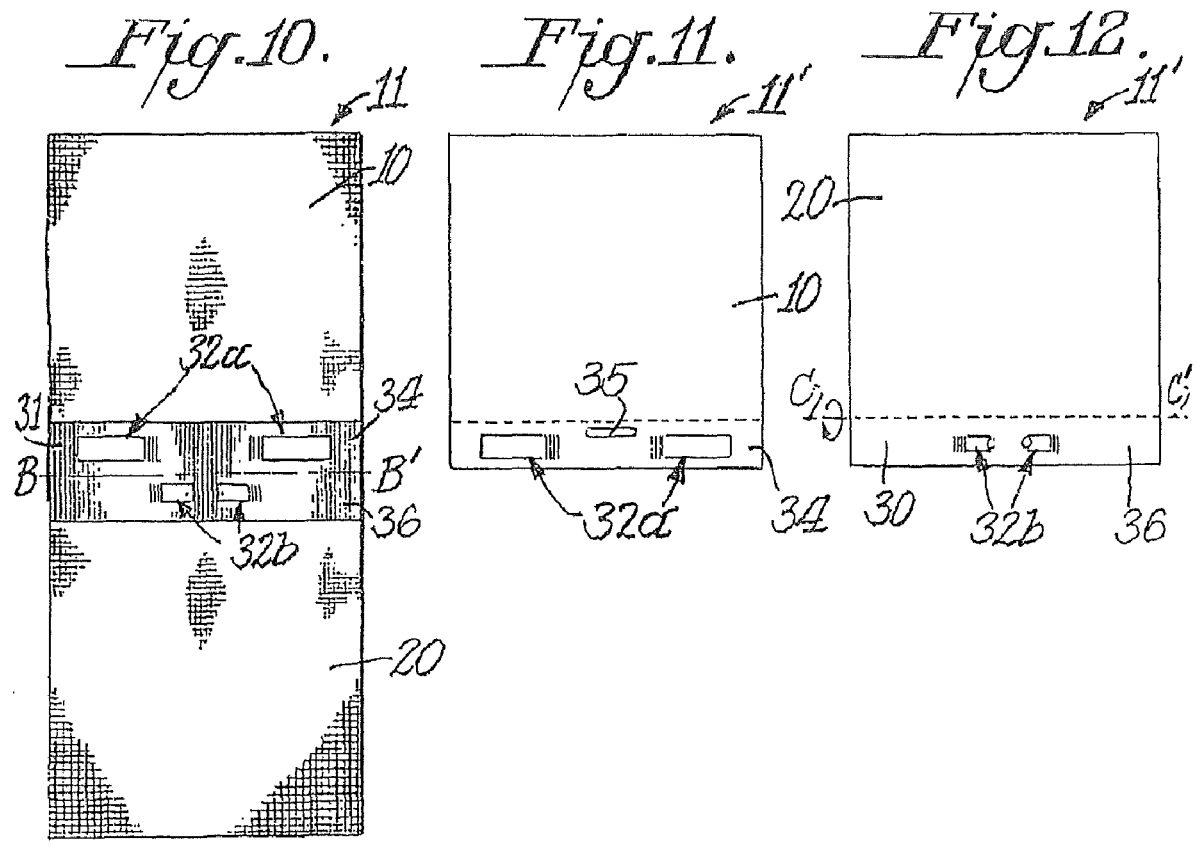
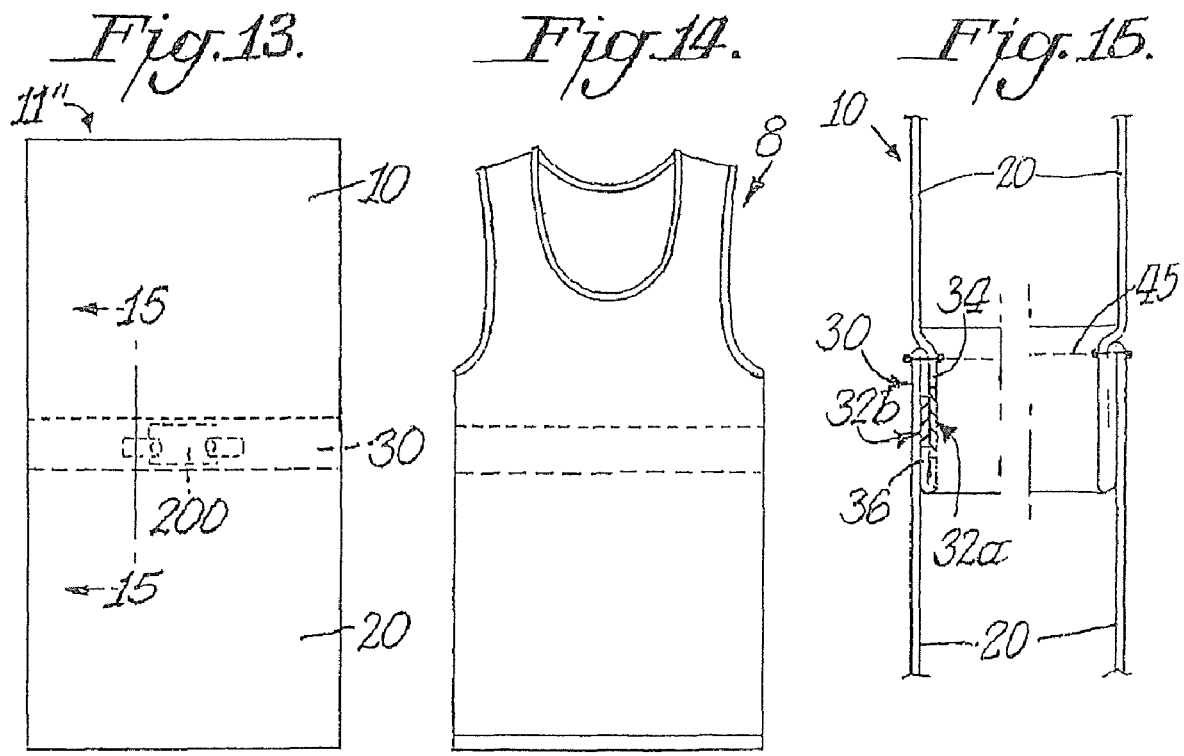

WEARABLE ARTICLE WITH BAND PORTION ADAPTED TO INCLUDE TEXTILE-BASED ELECTRODES AND METHOD OF MAKING SUCH ARTICLE

CROSS-REFERENCE TO RELATED APPLICATION

This application is a divisional of U.S. patent application Ser. No. 11/553,680, filed Oct. 27, 2006, now U.S. Pat. No. 7,878,030.

FIELD OF THE INVENTION

The present invention relates to a wearable article or garment formed by seamless circular knitting and having a band portion for snugly fitting around a wearer's torso, where the band portion may include a textile-based electrode or electrode system for monitoring signals, such as biophysiological signals, from the wearer. In addition to electrodes, various other components, such as sensors, connectors and wires can be incorporated in or on the band portion.

BACKGROUND OF THE INVENTION

U.S. Patent Application publication No. 2006/0117805, assigned to Koninklijke Philips Electronics N.V. discloses a loose fitting garment with a sensor band of generally smaller dimensions than the garment itself. The sensor band is elasticized to conform against the user's body, while the remainder of the garment is relatively loose fitting. The sensor band holds sensor electrodes incorporated in the band against a wearer's body. The sensor band is attached to the remainder of the garment by highly elastic and flexible webbing or linking portions that are formed by changing the knitting needles to reduce the tubular diameter of the circular knit in the process of knitting the garment, adding significant additional time and complexity to the knitting procedure.

Seamless tubular or circular knit garment blanks have been formed with a band or welt at one or more edges or selvages of the tubular blank. A band is typically a doubled over edge used for ornamentation, reinforcement or supporting the garment on the wearer, or any combination of these. U.S. Pat. No. 6,886,367 assigned to Sara Lee Corporation shows a circular knit brassiere construction with a lower band portion. U.S. Pat. No. 6,178,784 assigned to Alba-Waldensian, Inc. shows another brassiere construction with an integrally knit cylindrical tubular welt or band portion at the lower edge of the brassiere.

Heretofore, it has not been known to form an integrally knit band portion located in a central portion of a knit garment blank that is intended to remain as a band portion at the central portion of the finished knit garment. Most particularly, it has not been shown to form a band portion in a central portion of a garment wherein the upper and lower portions of the garment are single fabric plies.

SUMMARY OF THE INVENTION

In a first aspect, a circular knit tubing to make a wearable article has a first single layer tubular portion having first and second tubular portion ends, and a second single layer tubular portion having first and second tubular portion ends, wherein a tubular double welt or junction portion is disposed between the first single layer tubular portion and the second single layer tubular portion. The first tubular portion and the second tubular portion are joined together while the junction portion is folded to form the welt or band at the junction portion. The band so formed is positioned in the wearable article to wrap around and contact a wearer's chest, torso, abdomen, leg, arm or forehead. Most desirably, the first and second single layer tubular portions and the junction portion are continuously formed from one seamless circular knit tube.

To create a garment or wearable article with improved aesthetics, the second end of the second single layer tubular portion is folded back over the welt or band at a line formed where the first tubular portion and the junction portion or second tubular portion have been joined so that the second single layer tubular portion covers the band portion. The garment or wearable article can then be finished. For example, the first end of the first single layer tubular portion may be finished to form shoulder portions, arm holes, and a neck hole, and the second end of the second single layer tubular portion is finished to create leg holes or a shirt hem. Representative garments or wearable articles include: shirt, body garment, leotard, arm cuff, wrist cuff, hat, legging, stocking, and hosiery.

The band formed by the folded junction portion defines a central opening into which an electrical or electronic device or component may be inserted, housed, attached or mounted. The electrical or electronic device or component may attach to or communicate with one or more electrode(s). The central opening may communicate with a slot or opening for accepting the electronic device or other component. Representative electronic devices may include a heart rate monitor, an ECG, EEG or HRV monitor, an EMG, a pacemaker reader, a sensor, such as a galvanic skin sensor, a pulse oximeter, a thermistor, an antenna, an accelerometer, a battery, a data logger, a wireless transmitter, a display, an personal music player, a speaker, a cell phone, a PDA, a warming or cooling device, a respiration sensor, an LED, a light source, a vibrator, a doppler, a strain gauge, a dermal patch, an injection device, a tourniquet, or a pressure cuff. Other components that may be inserted into or associated with the central opening include wires, cables, interconnects, connectors, fiber optic light pipes, RIP bands or snaps.

In one embodiment, the junction portion has one or more textile-based electrodes formed therein. In another embodiment, folding of the junction portion causes a first textile-based electrode to come into physical and electrical contact with a second textile-based electrode formed in the junction portion. The electrical device in the central opening communicates with at least one of said textile-based electrode(s). In yet another embodiment, more than one band portion or double welt is formed in the wearable.

Another aspect is a method for making a seamless circular knit wearable article, comprising the steps of:
 knitting a first series of courses defining a first tubular portion;
  knitting to said first series of courses a second series of courses defining a tubular welt or junction portion;
  knitting to said junction portion a third series of courses defining a second tubular portion;
  folding the second tubular portion over the first tubular portion at a fold line within the junction portion;
  joining the first tubular portion to the second tubular portion around the tubular portions at a position spaced from the fold line to form a welt or band; and
  unfolding the second tubular portion.
Joining may be by stitching, knitting, heat sealing, spot welding or tacking. In one embodiment, the second tubular portion covers the welt or band when the second tubular portion is unfolded for improved garment or wearable article aesthetics.

The method steps may be repeated to form a second or multiple welts or bands in the garment.

A garment or wearable article with desired garment features may be formed. For example, neck and arm openings may be formed in the first tubular portion and leg openings or a shirt hem may be formed in the second tubular portion. Representative garments or wearable articles made according to the method include: shirt, body garment, leotard, arm cuff, wrist cuff, hat, legging, stocking, and hosiery.

In one embodiment, first and second textile-based electrodes may be formed in the circumferential tubular shaped junction portion, the first electrode for contacting the skin of wearer, the second electrode for connecting to an electronic device, wherein the first electrode physically contacts the second electrode in the band portion after the junction portion has been folded.

In another embodiment, one or more electrodes may be formed in or on the band or welt at the junction portion. The electrode may be any one or more of an integrally knit electrode in the tubing, a sewn-on electrode, first and second textile-based electrodes at opposite sides of the joinder line that overlap in the band portion, layer electrodes electrically connected via a conductive fiber junction, and a heat stamped metallic polymer electrode.

The method may further comprise inserting an electronic device or other component into the opening defined within the band portion through a slit or opening formed therein. The electronic device may be an HR monitor, an ECG, EEG or HRM monitor, an EMG, a pacemaker reader, a sensor, such as a galvanic skin sensor, a pulse oximeter, a thermister, an antenna, an accelerometer, a battery, a data logger, a wireless transmitter, a display, a personal music player, a speaker, a cell phone, a PDA, a warming or cooling device, a respiration sensor, an LED, a light source, a vibrator, a doppler, a strain gauge, a dermal patch, an injection device, a tourniquet, or a pressure cuff. Other components that may be inserted into or associated with the opening include wires, cables, interconnects, connectors, fiber optic light pipes, RIP bands or snaps.

BRIEF DESCRIPTION OF THE DRAWINGS

Novel features and advantages of the present invention in addition to those noted above will be become apparent to persons of ordinary skill in the art from a reading of the following detailed description in conjunction with the accompanying drawings wherein similar reference characters refer to similar parts and in which:

FIG. 1 shows an upper body wearable article (e.g., shirt) having a band portion that includes one or more textile-based electrodes;

FIG. 1A shows an electrical device for communication with the textile-based electrodes of FIG. 1;

FIG. 1B shows a wrist mountable display device for communicating with the electrical device shown in FIG. 1A;

FIG. 2 shows an alternate wearable article (e.g. unitard) adapted for wearing on the upper and lower body and having a band portion that includes textile-based electrodes comparable to the upper body wearable article of FIG. 1;

FIG. 10 shows a tubular knit blank in a first step of manufacture after knitting but before further assembly, wherein the blank has components of an integrated textile-based electrode system formed in a band portion;

FIG. 11 shows a first inside surface of the tubular knit blank of FIG. 10 after the bottom portion is folded over the top portion about fold line B-B';

FIG. 12 shows a second inside surface of knit blank of FIG. 11;

FIG. 13 shows an outside surface of knit blank of FIGS. 11 and 12 after the bottom portion of the blank is folded back from the top portion about stitched fold line C-C';

FIG. 14 shows an upper body wearable article (e.g. shirt) formed from the knit blank of FIG. 13 after armholes, neckline, and lower hem have been trimmed and finished; and FIG. 15 shows a cross-sectional view along line 15-15 of the band portion or junction portion of FIG. 13.

DETAILED DESCRIPTION OF AN EMBODIMENT

Figure 3:
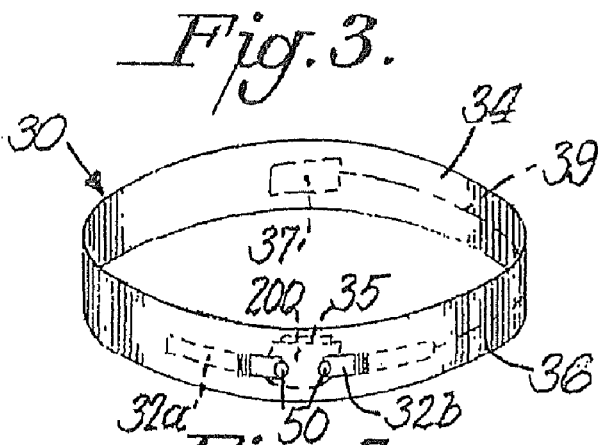
FIG. 3 shows a band portion or junction portion with multiple electrode systems spaced apart from one another around the band portion.

Turning in detail to the drawings, FIG. 1 shows a generally tubular circular knit garment 8 comprising an upper portion 10, a lower portion 20, and a band portion 30 at the junction between the upper portion 10 and the lower portion 20. Garment 8 is a sleeveless shirt with a scoop neckline, but may be formed to have sleeves or other neckline styles as desired. Portions 10 and 20 are joined to band portion 30 by stitching as discussed in more detail below. Band portion 30 has a generally tubular shape that extends around the inner circumference of the generally tubular shaped article 8. If desired, multiple band portions may be formed in the garment 8 although FIG. 1 shows a single band portion 30. The band portion 30 defines a central opening therein into which an electrical or electronic device 200 or other component may be inserted or housed.

The band portion 30 optionally may include an electrode system 32, which is surrounded by and electrically isolated from the nonconducting portions of band portion 30. If incorporated into the garment, the electrode system 32 may be adapted for use with an electrical or electronic device 200, shown in FIG. 1A, such as an electrical signal processing device. The electrical or electronic device 200 may be a heart rate monitor, ECG, EEG or HRV monitor, EMG, pacemaker reader, sensor, such as a galvanic skin sensor, pulse oximeter, thermister, antenna, accelerometer, battery, data logger, wireless transmitter (such as a WEARLINK transmitter by Polar), display, personal music player (e.g., Mp3), speaker, cell phone, PDA, warming or cooling device, respiration sensor, LED, light source, vibrator, Doppler generator or receiver, strain gauge, dermal patch, injection devices, tourniquet, or pressure cuff. The electrical device 200 may be inserted through opening 35.

In addition to or in place of an electrical device 200, the band portion 30 may house or hold therein or thereon other components (not shown), such as wires, cables, interconnects, connectors, fiber optic light pipes, RIP bands and/or snaps.

The electrical device 200 may transmit a signal representative of, for example, a monitored biophysiological signal to a display device, such as a wrist-worn display device 202 shown in FIG. 1B. The display device may also be housed within exercise apparatus or medical apparatus or other unit (not shown). The display device 202 displays a representation of the electrical signal communicated from the electrical device 200. The electrode system 32 is capable of being adapted for the transmission of electrical signals to or from the wearer's skin. For example, such textile-based electrode may be adapted for the biophysiological monitoring of the wearer utilizing passively measured signals and/or measuring the body's response to applied electrical stimulation.

A textile-based electrode system 32 optionally may have at least a first fabric portion 34 and a second fabric portion 36, as shown in FIG. 3 (see also FIGS. 10-14), disposed in an at least partially overlapping relationship to form the band portion 30, which is connected at the junction between upper tubular portion 10 and lower tubular portion 20 of, for example, wearable article 8, shown in FIG. 1. The first fabric portion 34 may comprise at least a first electrically conductive region (a first "electrode") 32a, and the second fabric portion 36 may comprise at least a second electrically conductive region (a second "electrode") 32b. The first electrode 32a and second electrode 32b can cooperate to provide a region of at least partial physical contact between confronting surfaces of said electrodes 32a and 32b. This physical contact region can thereby establish electrical conduction between the first and second electrodes. The electrodes may be textile-based and may be capable of being fully integrated with the non-conducting fabric of the band portion 30 to allow contact of the electrode with the wearer's corpus/body.

FIG. 2 illustrates a body garment 9 constructed similarly to the garment 8 in FIG. 1, wherein body garment 9 incorporates a band portion 30. The body garment 9 may be a unitard or leotard or a sports or athletic garment. Generally speaking, band portion 30 may be placed at approximately the torso or chest region of the garments 8 or 9. The band portion 30 and upper portion 10 of garment or wearable article 9 may be substantially similar to those portions on garment or wearable article 8, while the lower portion 20' includes a crotch portion and leg portions.

Upper portion 10 of article 9 may also be adapted with sleeves, or a different neckline, or other upper garment features (not shown) as familiar to those skilled in the art. Specific examples of garments include shirts, tank tops, full upper and lower body garments, such as leotards or unitards, and underwear. The tubular shaped garment may also be adapted for use around an arm or leg by creating a cuff, band, stocking, or legging. Although the invention will generally be described below with particular reference to garment 8, it should be understood that such reference to a particular garment is illustrative only.

As shown in FIGS. 3 through 9, one the optional electrode system 32 that may be incorporated into the garment construction may be comprised of conductive portions, or electrodes 32a and 32b, which may be fully integrated with article 8 and adapted to contact the corpus/body of the wearer. FIG. 3 omits upper and lower portions 10 and 20 for simplicity and to show the orientation of electrodes 32b on the outside fabric portion 36 of band portion 30. Also illustrated in FIG. 3 is an optional grounding electrode 37 that may be provided to reduce or cancel out any electrical noise and may be connected to electrode system 32 by electrical conductor or wire 39. A system with optional additional electrodes is described in pending U.S. patent application Ser. No. 11/163,017, filed Sep. 30, 2005, titled "Physiological Monitoring Wearable Having Three Electrodes", the disclosure of which is incorporated herein by reference for all useful purposes.

A knit construction can be used for the nonconductive fabric of garment 8, as well as for the conductive fabric of the optional electrode system 32. The knit construction may, for example, be chosen from among single jersey, mock ribbed knit, and ribbed knit 1×1 and 1×3 constructions. As is known to a person having skill in the art, in such knit fabrics, the wales, or vertical rows of stitches, typically intermesh alternately on the face (odd number wales) and on the back (even number wales) of the fabric. Rib-knit fabrics of this type have been shown to have good elasticity in the length and width directions and can provide good body form fitting garments. The electrically conductive yarns used in the electrode system 32 can be electrically isolated from, the first and second fabric portions 34 and 36 of band portion 30.

Electrically nonconductive yarns or traditional textile yarns can be advantageously employed for the bulk of the fabric portions. These yarns can include, for example, cotton, cellulosics, silk, ramie, polyester, and/or nylon. The bulk of the fabric portions can also include combinations of polyester and nylon "hard" yarns with elastic yarns such as LYCRA® brand spandex from INVISTA™ S. à r. l., of Wilmington, Del., USA.

Conductive yarn may be used as part of the optional electrode system 32 to establish an electrical connection with the body. For example, first and second textile-based electrodes 32a and 32b may be electrically conductive yarn stitched, knit or woven into portions of the fabric of the band portion 30 to form patches or ribs of conductive knit fabric. Exemplary conductive yarns are disclosed by Karayianni in WO 2004/097089 A1, of which the disclosure is incorporated herein by reference for all useful purposes.

Materials suitable for use as conductive yarn include, for example, those yarns disclosed in WO 2004/097089 A1 (Karayianni), cited previously. The elastic, conductive yarns disclosed therein (hollow spindle double covered 70 denier nylon yarn and 20 micron silver plated copper wire from Elektro Feindraht), on LYCRA® Type 162 "clear" hereinafter called ETG1 yarns, can inherently provide elastic stretch and recovery and can lend themselves to knit constructions as disclosed herein. Inelastic conductive filaments suitable for preparing the elastic conductive yarns according to the disclosures in WO 2004/097089A1 include those yarns from BEKAERT Fibre Technologies of Marietta, Ga., USA (such yarns may comprise CONDUFIL® 80 dtex and 24 filament yarns) and Xstatic® (e.g. 70 denier 2 ply silver metallized nylon yarn of 70 denier and 34 filaments) from Laird Sauquoit Industries (Scranton, Pa., USA 18505).

Figure 4:
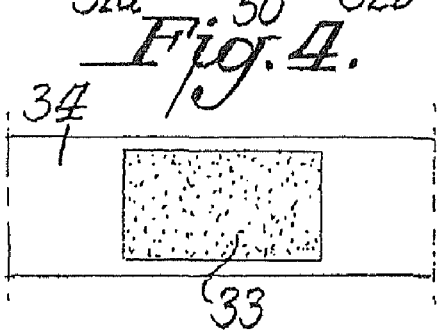
FIG. 4 shows a top plan view of a first textile-based electrode.
Figure 5:
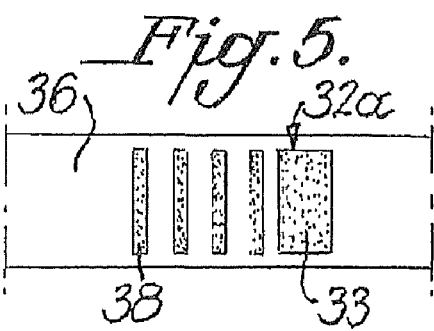
FIG. 5 shows a bottom plan view of a first textile-based electrode.
Figure 6:
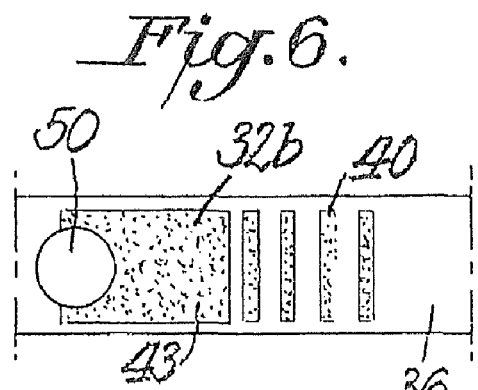
FIG. 6 shows a top plan view of a second textile-based electrode.
Figure 7:
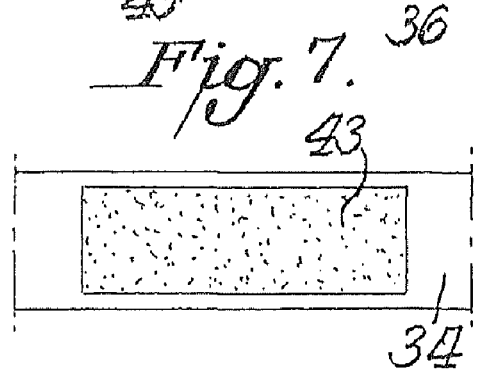
FIG. 7 shows a bottom plan view of a second textile-based electrode.
Figure 8:
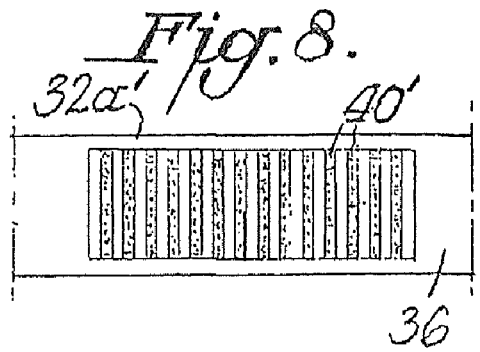
FIG. 8 shows a textile-based electrode comprising electrically conductive regions made using different types of knit construction.

FIGS. 4 through 8 illustrate several optional exemplary electrodes, which are also described U.S. patent application Ser. No. 11/082,240, filed Mar. 16, 2005, cited and incorporated by reference above. FIGS. 4 and 5 show schematic representations of the top and bottom plan views of the inner, or first, electrode 32a, which may comprise knit patches of conductive yarn 33 with raised portions or ribs 38. FIGS. 6 and 7 show schematic representations of the top and bottom plan views of the outer, or first, electrode 32b, which may comprise knit patches of conductive yarn 43 with raised portions or ribs 40. FIG. 8 shows electrode 32a', which has an alternative top design to that shown on inner electrode 32a. Electrode 32a' may have a continuous series of raised conductive portions 40' made using different types of knit construction, including a ribbed construction (e.g., 1×1 or 1×3 rib). The design of any of these electrodes may be adopted in forming optional grounding electrode 37.

The operating aspects of the invention will now be more particularly described. Returning to FIGS. 1 and 2, wearable articles 8 and 9 are shown with a band portion 30 with an integrated textile-based electrode system 32. As also shown in FIG. 3, metallic connectors 50 or snaps may be provided for connection to electrical or electronic device 200, which may be inserted into the band portion interior through slot 35. Slot 35 may be provided in second fabric portion 36 only, or it may optionally also be provided in lower portion 20. Electrodes 32a and 37 on fabric portion 34 are shown in phantom to illustrate orientation in FIG. 3.

Figure 9:
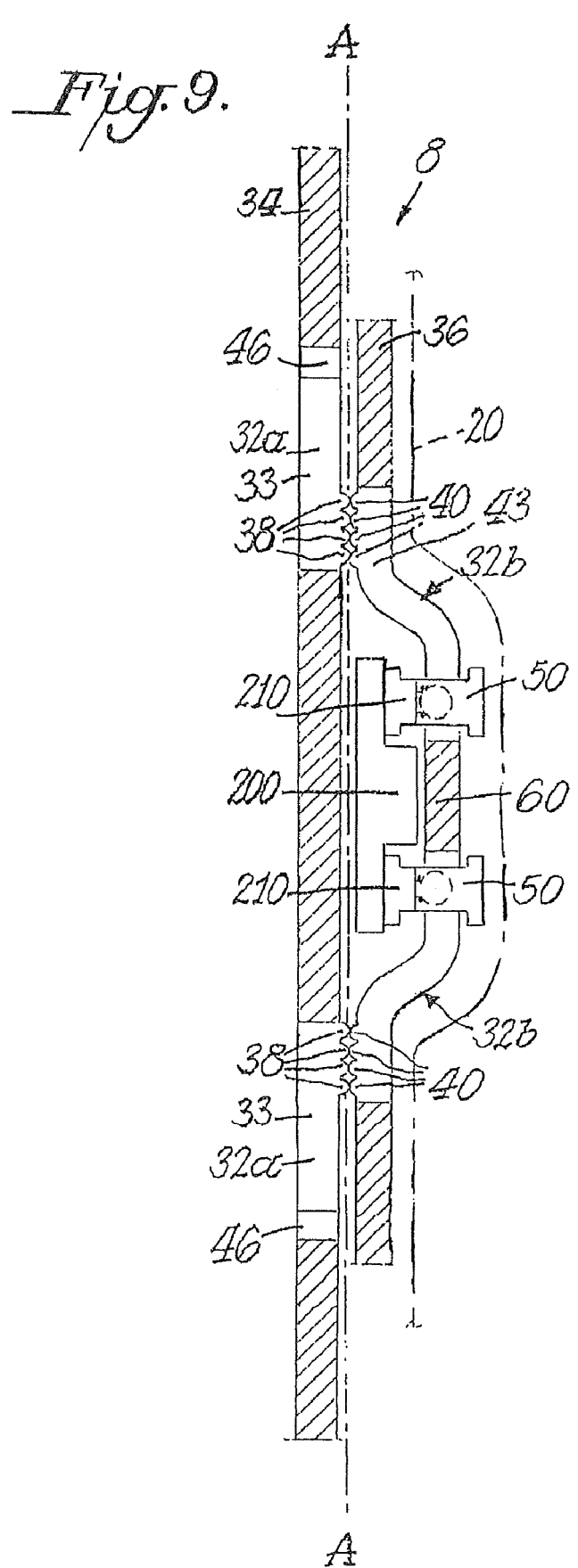
FIG. 9 shows a cross-sectional view taken along line 9-9 of FIG. 1 and rotated by 90° to fit lengthwise on the drawing sheet showing a pair of textile-based electrodes adapted to communicate with electronics capable of biophysical monitoring.

FIG. 9 is a partial cross-section along line 9-9 of FIG. 1 and shows how electrical or electronic device 200 is held between first and second fabric portions 34 and 36 and oriented with regard to the optional electrodes 32a and 32b. The device 200 may be capable of biophysiological monitoring, such as sensing electrical signals associated with the electrical activity of the heart of the wearer or associated with chest movement of the wearer from breathing, and, thus, the number of heart beats per unit time. Device 200 is inserted through slot 35 into the space between confronting fabric surfaces 34 and 36 of the folded over band portion 30. Device 200 may have two ball type electrode connectors 210 that engage with conductive contacts 50, which are attached to conductive yarn portions 32b. Electrically conductive contacts 50 may be made of any electrically conductive material, such as, for example, metallic conductors. Electrically conductive contacts 210 may have a partially spherical geometry for snap connection with contacts 50. The snap-engaged contacts 50 suitable for this application can, for example, be 11 mm contacts, available from PRYM NEWEY Textiles Group, Whitecroft, Lydney, Gloucestershire, UK. Reinforcement fabrics (not shown) can be provided under each snap 50, for example, in the form of a woven piece of CORDURA/COOLMAX® fabric available from INVISTA Sà r.l. These reinforcement fabrics can serve to reduce the wear and help extend the service life of the snaps 50 located in the textile electrodes 32b.

Through electrode system 32, an electrical signal can be conducted via electrode 32b and contact 50 to electrically conductive contacts 210, which are associated with electrical device 200. It is of course, contemplated that an electrical signal alternatively may instead originate from electrical device 200 and be conducted to the skin by electrodes 32a.

A simplified and cost-effective method for making a wearable article with a band portion at the chest region that is adapted to include textile-based electrodes is shown by way of example in FIGS. 10 to 14. The wearable article, such as articles 8 or 9 in FIGS. 1 and 2, can be made using seamless (circular) knitting equipment. Circular knitting processes can be carried out on commercially available equipment, such as a SMA-8-TOP1 seamless 13 inch body size SANTONI knitting machine (from GRUPPO LONATI, Italy).

Referring first to FIG. 10, a knitted blank 11 is formed as a single circular knitted tube with an upper portion 10 and lower 20 portion separated by, and connected to, a junction portion 31, which has a first portion 34 and second portion 36 oriented above and below line B-B'. Preferably, portions 10, 20, and 31 are seamlessly and continuously formed of the same circular knit tube. Alternatively, they may be formed separately and joined together to form the blank 11, shown in FIG. 10, by stitching, cut-and-sew or other joining method known to those skilled in the art.

The stitching pattern may change from a first circular knit pattern to a second circular knit pattern between the first series of courses defining the upper portion 10 and the second series of courses defining the junction portion 31. The stitching pattern may then again change from the second circular knit pattern between the second series of courses defining the junction portion 31 and the third series of courses defining the lower portion 20 of the blank 11. While the junction portion 31 is shown to have a straight line connection with the upper portion 10 and a straight line connection with the lower portion 20, stitch patterns may be varied at these connections to form curved or other shaped connection zones.

After forming the circular knit tubular blank 11, the next step of the method is shown in FIGS. 11 and 12. The lower portion 20 and second portion 36 of the blank 11 are be folded over the upper portion 10 and first portion 34 about line B-B' in FIG. 10 to form a two layer tube blank 11', as represented in FIGS. 11 and 12. FIG. 11 illustrates the tube 11' turned inside out and shows the position of electrodes 32a. FIG. 12 illustrates the tube 11' as formed by the folding process about line B-B' in FIG. 10, and shows the positioning of electrodes 32b on fabric portion 36. FIGS. 11 and 12 are related in that both figures show two layer tube blank 11', but FIG. 11 shows such tube blank 11' as turned inside out from the view of the blank 11' shown in FIG. 12.

First and second fabric portions 34 and 36 of junction portion 31 then may be joined or attached, by stitching, gluing or other suitable method, around the circumference of the blank at line C-C' to form the band portion 30. The distance from B-B' to C-C', i.e. the width of band portion 30, may be determined based on the size of device 200 to be held between fabric portions 34 and 36 in the band portion 30 or may be based on other design parameters. With the fabric portions so joined, the band portion 30 defines an internal space between the confronting surfaces of the fabric portions 34 and 36. The confronting surfaces of the electrodes 32a and 32b are in contact with one another within that internal space within the band portion 30. On a circular knitting machine, such as a SANTONI machine, the joining step may be accomplished by having the transfer jacks hold the yarn for a desired number of courses to make the welt or band width at the junction portion. Thereafter, the jacks transfer the stitches to rejoin or make the folded portion of the double welt or band and continue around the remaining of the garment. These steps may be repeated if a second or multiple double welt or band portions are to be formed in a single garment. One may repeat this process as many times as needed to form several band portions on the garment.

After the fabric portions 34 and 36 have been joined to form band portion 30, lower portion 20 of blank 11' may then be folded back down from upper portion 10 about line C-C' as indicated by the rotation arrow about line C-C' in FIG. 12 to form tube blank 11", shown in FIG. 13. Tube blank 11" in FIG. 13 thus has a single ply of fabric at top portion 10, a single ply of fabric at bottom portion 20, and a band portion 30 formed at a central portion or junction portion between the bottom portion 20 and top portion 10. The fabric of the bottom portion 20 overlays the band portion 30 and covers the electrodes 32b from view.

FIG. 15 is a cross-section taken along line 15-15 of FIG. 13 and shows more clearly the construction of the band portion 30 in the tube blank 11". Band portion 30 extends around the whole circumference of the tube blank 11" and is covered by the folded back fabric forming the bottom portion 20 of the garment. Hence, FIG. 15 shows the band portion 30 as it would be seen in cross-section taken through both the front and rear of the tube blank 11". The band portion 30 at the front of the tube blank 11" includes electrodes 32a and 32b (see left side portion of FIG. 15), whereas the band portion 30 at the rear of the tube blank 11" for this cross-sectional view does not include electrodes (see right side portion of FIG. 15). Because electrodes may be disposed at varying locations within band portion 30, FIG. 15 is not intended to be limiting. Stitching line 45 is shown in FIG. 15, which represents connection along line C-C' (shown in FIG. 12) accomplished by stitching. As stated earlier, such connection at the junction portion may be by other joining means or technique, such as tacking (e.g., bar tacking), knitting (e.g., dial knitting), heat sealing or spot adhering.

Finally, the armholes, neckline and bottom hem can be trimmed and finished to form a finished wearable article 8, as shown in FIG. 14. The bottom hem alternatively may be formed as an integral knit welt or band. To create the one piece unitard or leotard of FIG. 2, the bottom portion 20 may alternatively be cut and stitched to form leg openings and a crotch region.

The wearable articles 8, 9 have a band portion 30 that may more tightly fit around a wearer's chest or torso for better contact when such wearable article includes electrodes or other physiological monitoring means. The wearable articles 8, 9 are not as limiting as the brassieres designed solely for women. Such wearable articles 8, 9 have styles that are more comfortable for men, but also could be worn by women. The top portion 10 and bottom portion 20 may be sized so as to fit more loosely than the band portion 30, thus providing more comfort.

The garment or wearable construction surprisingly has a single fabric layer top portion 10 and a single fabric layer bottom portion 20 with a band or double welt portion 30 located approximately centrally. The garment or wearable is more comfortable and cooler since in major part the garment or wearable is a single fabric layer. In addition, the band is hidden from view—covered by the bottom portion 20 after that portion has been folded back, which improves garment aesthetics. Electrodes and other components may be incorporated on or in the band. Sensors or other components may contact the skin, yet electrodes associated with such sensors or components are buffered or insulated from the skin for enhanced comfort. If desired, the band or double welt portion 30 need not be central within the garment. In addition, if desired, multiple bands or double welt portions may be formed in the garment, such as by separately sewing in a fabric band or by repeating the method steps for forming the first band or double welt portion in the circular knit to create a second or another band or double welt portion.

It should be understood that the above detailed description while indicating preferred embodiments of the invention are given by way of illustration only since various changes and modifications within the spirit and scope of the invention will become apparent to those skilled in the art from the detailed description.

What is claimed is:

1. A circular knit tubing to make a wearable article, comprising:
    a first single layer tubular portion having first and second tubular portion ends,
    a tubular double welt or junction portion, said junction portion having first and second tubular portion ends, the first tubular end of the junction portion connected to the second tubular end of the first portion;
    a second single layer tubular portion having first and second tubular portion ends, the first tubular end of the second portion connected to the second end of the junction portion;
    a fold in the junction portion; and
    means for joining the first tubular portion and the second tubular portion together while the junction portion is folded to form a welt or band at the junction portion, wherein the second end of the second single layer tubular portion is folded back over the welt or band at a line formed where the first tubular portion and the junction portion or second tubular portion have been joined so that the second single layer tubular portion covers the band portion.

2. The circular knit tubing of claim 1, wherein the junction portion has a textile-based electrode formed therein.

3. The seamless circular knit tubing of claim 1, wherein the band is positioned in the wearable article to wrap around and contact a wearer's chest, torso, abdomen, leg, arm or forehead.

4. The circular knit tubing of claim 2, wherein the folding of the junction portion causes a first textile-based electrode to come into physical and electrical contact with a second textile-based electrode formed in the junction portion.

5. The circular knit tubing of claim 1, wherein the band formed by the folded junction portion defines a central opening into which an electrical or electronic device or component may be inserted, attached or mounted.

6. The circular knit tubing of claim 4, wherein the band formed by the folded junction portion defines a central opening into which an electrical or electronic device or component may be inserted, attached or mounted for electrical contact with one or more of the textile-based electrodes.

7. The circular knit tubing of claim 5, wherein central opening in the band communicates with a slot for accepting the electronic device or component.

8. The circular knit tubing of claim 5, wherein the electronic device is a heart rate monitor, an ECG, EEG or HRV monitor, an EMG, a pacemaker reader, a galvanic skin sensor, a pulse oximeter, a thermister, an antenna, an accelerometer, a battery, a data logger, a wireless transmitter, a display, an personal music player, a speaker, a cell phone, a PDA, a warming or cooling device, a respiration sensor, an LED, a light source, a vibrator, a doppler, a strain gauge, a dermal patch, an injection device, a tourniquet, or a pressure cuff.

9. The circular knit tubing of claim 5, wherein the electrical component is a wire, a cable, an interconnect, a connector, a RIP band or a snap.

10. The circular knit tubing of claim 1, wherein the first end of the first single layer tubular portion is finished to form shoulder portions, arm holes, and a neck hole.

11. The circular knit tubing of claim 1, wherein the second end of the second single layer tubular portion is finished to create leg holes or a shirt hem.

12. The circular knit tubing of claim 1, wherein the first end of the first single layer tubing is finished to form an opening for a wearable article selected from the group consisting of: shirt, body garment, leotard, arm cuff, wrist cuff, hat, legging, stocking, and hosiery.

13. The circular knit tubing of claim 11, wherein the second end of the second single layer tubing is finished to form an opening for a wearable article selected from the group consisting of: shirt, body garment, leotard, arm cuff, wrist cuff, hat, legging, stocking, and hosiery.

14. The circular knit tubing of claim 1, wherein the first and second single layer tubular portions and the junction portion are continuously formed from one seamless circular knit tube.

15. The circular knit tubing of claim 1, further comprising a second welt or band in the circular knit tubing.

16. A method for making a seamless circular knit wearable article, comprising:
    knitting a single layer tubing;
    forming a welt or band in said tubing with a pick up stitch;

folding a portion of the single layer tubing back over the welt or band at a line formed at the pick up stitch so that a single layer of knit single layer tubing covers the band portion; and finishing the tubing to form the wearable article, wherein the band contacts skin of a wearer who wears the wearable article.

17. The method of claim 16, further comprising: forming an electrode in or on the band.

18. The method of claim 16, further comprising: forming a second welt or band in said tubing with a pick up stitch, wherein the second band contacts skin of the wearer who wears the wearable article.

19. A circular knit tubing to make a wearable article, comprising:
a first single layer tubular portion having first and second tubular portion ends,
a tubular double welt or junction portion, said junction portion having first and second tubular portion ends, the first tubular end of the junction portion connected to the second tubular end of the first portion;
a second single layer tubular portion having first and second tubular portion ends, the first tubular end of the second portion connected to the second end of the junction portion;
a fold in the junction portion;
means for joining the first tubular portion and the second tubular portion together while the junction portion is folded to form a welt or band at the junction portion;
a first textile-based electrode formed in the junction portion; and
a second textile-based electrode formed in the junction portion;
wherein the folding of the junction portion causes the first textile-based electrode to come into physical and electrical contact with the second-textile based electrode.

20. The circular knit tubing of claim 19, wherein the band formed by the folded junction portion defines a central opening into which an electrical or electronic device or component may be inserted, attached or mounted for electrical contact with one or more of the textile-based electrodes.

21. A circular knit tubing to make a wearable article, comprising:
a first single layer tubular portion having first and second tubular portion ends,
a tubular double welt or junction portion, said junction portion having first and second tubular portion ends, the first tubular end of the junction portion connected to the second tubular end of the first portion;
a second single layer tubular portion having first and second tubular portion ends, the first tubular end of the second portion connected to the second end of the junction portion;
a fold in the junction portion; and
means for joining the first tubular portion and the second tubular portion together while the junction portion is folded to form a welt or band at the junction portion;
wherein the band formed by the folded junction portion defines a central opening which communicates with a slot adapted to receive an electrical or electronic device or component.

* * * * *